(12) United States Patent
Hulsebos et al.

(10) Patent No.: US 11,181,836 B2
(45) Date of Patent: Nov. 23, 2021

(54) METHOD FOR DETERMINING DEFORMATION

(71) Applicant: ASML NETHERLANDS B.V., Veldhoven (NL)

(72) Inventors: Edo Maria Hulsebos, Waalre (NL); Patricius Aloysius Jacobus Tinnemans, Hapert (NL); Franciscus Godefridus Casper Bijnen, Valkenswaard (NL)

(73) Assignee: ASML Netherlands B.V., Veldhoven (NL)

( * ) Notice: Subject to any disclaimer, the term of this patent is extended or adjusted under 35 U.S.C. 154(b) by 142 days.

(21) Appl. No.: 16/623,912

(22) PCT Filed: May 28, 2018

(86) PCT No.: PCT/EP2018/063933
§ 371 (c)(1),
(2) Date: Dec. 18, 2019

(87) PCT Pub. No.: WO2019/001871
PCT Pub. Date: Jan. 3, 2019

(65) Prior Publication Data
US 2021/0149316 A1 May 20, 2021

(30) Foreign Application Priority Data
Jun. 26, 2017 (EP) .................... 17177800

(51) Int. Cl.
*G03F 9/00* (2006.01)
*G03F 7/20* (2006.01)

(52) U.S. Cl.
CPC ........ *G03F 9/7088* (2013.01); *G03F 7/70633* (2013.01); *G03F 9/7046* (2013.01); *G03F 9/7076* (2013.01); *G03F 9/7092* (2013.01)

(58) Field of Classification Search
CPC ............ G03F 7/70633; G03F 7/70483; G03F 7/70491; G03F 7/705; G03F 9/7046; G03F 9/7076
See application file for complete search history.

(56) References Cited

U.S. PATENT DOCUMENTS 6,961,116 B2  11/2005  Den Boef et al.
7,558,643 B2   7/2009  Van Der Schaar et al.
(Continued)

FOREIGN PATENT DOCUMENTS

CN  101923289  12/2010
CN  103338891  10/2013
(Continued)

OTHER PUBLICATIONS

Chinese Office Action issued in corresponding Chinese Patent Application No. 201880042682.9, dated Mar. 9, 2021.
(Continued)

*Primary Examiner* — Steven Whitesell Gordon
(74) *Attorney, Agent, or Firm* — Pillsbury Wnthrop Shaw Pittman LLP

(57) ABSTRACT

A method for determining substrate deformation includes obtaining first measurement data associated with mark positions, from measurements of a plurality of substrates; obtaining second measurement data associated with mark positions, from measurements of the plurality of substrates; determining a mapping between the first measurement data and the second measurement data; and decomposing the mapping, by calculating an eigenvalue decomposition for the mapping, to separately determine a first deformation (e.g. mark deformation) that scales differently from a second deformation (e.g. substrate deformation) in the mapping (Continued)

between the data. The steps of determining a mapping and decomposing the mapping may be performed together using non-linear optimization.

20 Claims, 4 Drawing Sheets

(56) References Cited

U.S. PATENT DOCUMENTS

| | | | |
|---|---|---|---|
| 2004/0189964 | A1 | 9/2004 | Nijmeijer et al. |
| 2007/0212856 | A1 | 9/2007 | Owen |
| 2013/0313674 | A1 | 11/2013 | Noda |
| 2016/0077445 | A1 | 3/2016 | Den Boef et al. |
| 2016/0246185 | A1 | 8/2016 | Ypma et al. |
| 2018/0348654 | A1* | 12/2018 | Bijnen ............... G03F 7/70508 |
| 2020/0233315 | A1* | 7/2020 | Nue .................. G06K 9/6247 |

FOREIGN PATENT DOCUMENTS

| | | |
|---|---|---|
| EP | 1058156 | 12/2000 |
| JP | 2009529785 | 8/2009 |
| TW | 201506551 | 2/2015 |
| TW | I582878 | 5/2017 |
| WO | 2017009036 | 1/2017 |
| WO | 2017009166 | 1/2017 |
| WO | 2017032534 | 3/2017 |
| WO | 2017060054 | 4/2017 |

OTHER PUBLICATIONS

Lam, Auguste et al.: "Overlay breakdown methodology on immersion scanner", Proc, of SPIE, p. 76383L-1-76383L-12, vol. 7638, Jan. 4, 2010.

Japanese Office Action issued in corresponding Japanese Patent Application No. 2019-565859, dated Jan. 19, 2021.

International Search Report and Written Opinion issued in corresponding PCT Patent Application No. PCT/EP2018/063933, dated Oct. 18, 2018.

Taiwanese Office Action issued in coresponding Taiwanese Patent Application No. 107121792, dated Jan. 7, 2019.

Lam, Auguste et al.: "Pattern recognition and data mining techniques to identify factors in wafer processing and control determining overlay error", Proc. of SPIE, vol. 9424, Mar. 19, 2015.

Korean Office Action issued in corresponding Korean Patent Application No. 10-2019-7038064, dated Jul. 22, 2021.

Lam, A et al.: "Pattern recognition and data mining techniques to identify factors in wafer processing and control determining overlay error", Proc. of SPIE, vol. 94241 (Mar. 2015).

* cited by examiner

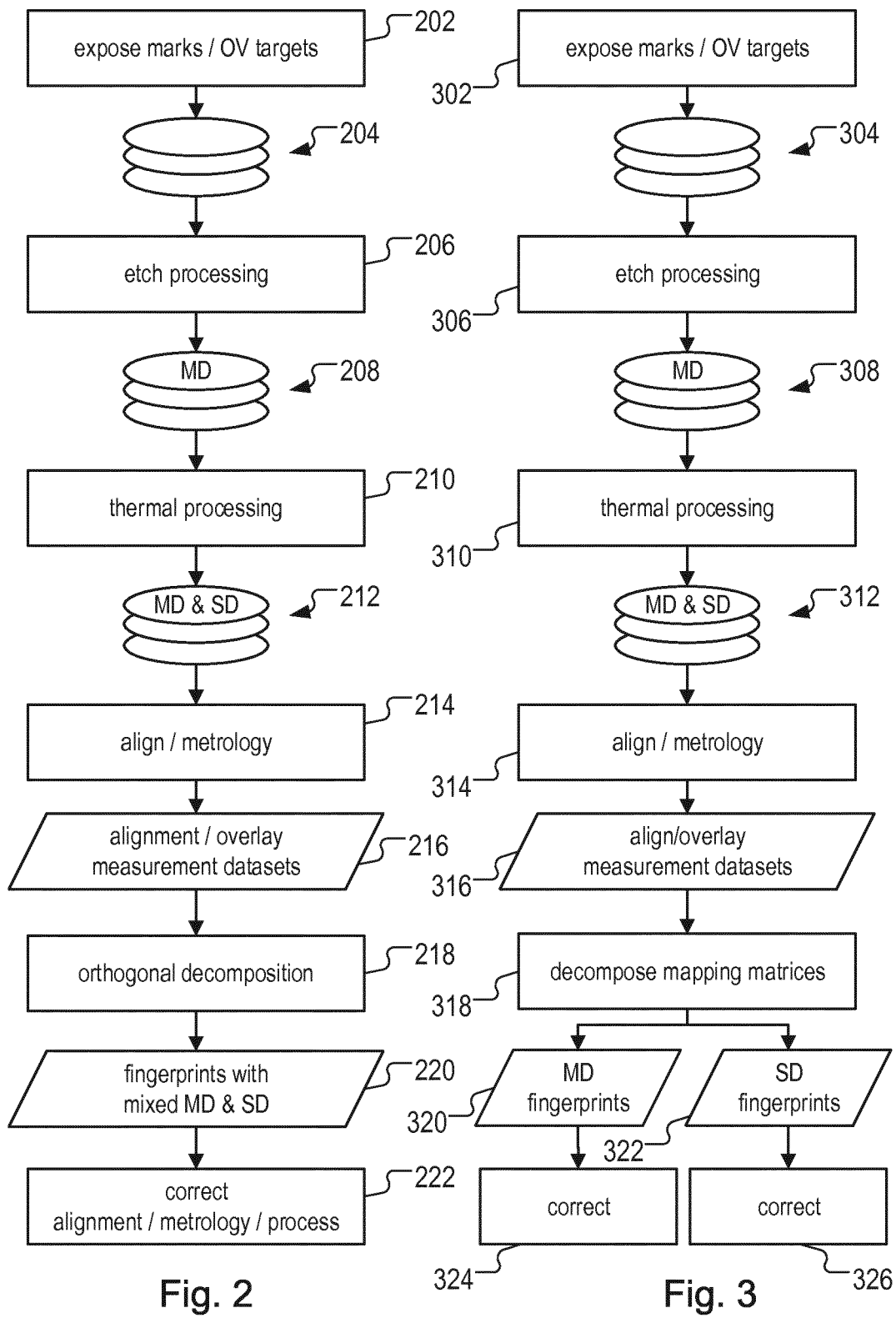

METHOD FOR DETERMINING DEFORMATION

CROSS-REFERENCE TO RELATED APPLICATIONS

This application is the U.S. national phase entry of PCT Patent Application No. PCT/EP2018/063933, filed on May 28, 2018, which claims the benefit of priority of European Patent Application No. 17177800.4, which was filed on Jun. 26, 2017 and which is incorporated herein in its entirety by reference.

BACKGROUND

Field of the Invention

The present invention relates to a method for determining deformation, such as alignment mark deformation and substrate deformation in a lithographic process. The present invention also relates to associated methods of alignment, metrology and correcting a lithographic process, and to computer programs, computer program products, and computer apparatus.

Background Art

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., including part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. These target portions are commonly referred to as "fields". Wafers are processed in batches or lots through various apparatuses in the semiconductor fabrication facility (fab). The integrated circuit is built up layer by layer with a lithographic step performed by a lithographic apparatus at each layer and other fab processes being performed in between lithographic steps.

The accurate placement of patterns on the substrate is a chief challenge for reducing the size of circuit components and other products that may be produced by lithography. In particular, the challenge of measuring accurately the features on a substrate which have already been laid down is a critical step in being able to align successive layers of features in superposition accurately enough to produce working devices with a high yield. So-called overlay should, in general, be achieved within a few tens of nanometers in today's submicron semiconductor devices, down to a few nanometers in the most critical layers.

Consequently, modern lithography apparatuses involve extensive measurement or 'mapping' operations prior to the step of actually exposing or otherwise patterning the substrate at a target location. So-called advanced alignment models have been and continue to be developed to model and correct more accurately non-linear distortions of the wafer 'grid' that are caused by processing steps and/or by the lithographic apparatus itself. Not all distortions are correctable during exposure, however, and it remains important to trace and eliminate as many causes of such distortions as possible.

These distortions of the wafer grid are represented by measurement data associated with mark position. The measurement data are obtained from measurements of wafers. An example of such measurements are alignment measurements of alignment marks performed using an alignment system in a lithographic apparatus prior to exposure. Another example of such measurements are overlay measurements of overlay targets performed using a metrology system after exposure.

Due to processing, alignment marks and overlay targets are deformed, which results in measurement errors, causing an overlay penalty. Mitigation of the impact of this deformation is conventionally performed by selecting or weighting the illumination color used for the measurements.

International Patent Application Publication WO2017032534, which is incorporated herein in its entirety by reference, discloses selecting the optimal color for wafer alignment and the estimated best wavelength for alignment and overlay metrology.

International Patent Application Publication WO2017009036, which is incorporated herein in its entirety by reference, discloses weighting the illumination color and performing a blind source separation method such as Principal Component Analysis (PCA) to characterize deformation of substrates. This exploits the color-to-color properties of mark deformation to reduce the measurement error.

As described in WO2017009036, one needs be able to distinguish between the effects of a mark deformation and the effects of a substrate deformation, in order to arrive at a proper assessment of the actual alignment mark position.

In between two consecutive exposure steps, i.e. the consecutive application of particular patterns onto target portions, a substrate undergoes various processes outside the lithographic apparatus. These processes may cause substrate deformations and mark deformations including mark asymmetries.

Two types of process equipment are generally used for the processing of substrates outside a lithographic apparatus, affecting the substrates in a different manner.

A first type of equipment can be characterized as surface modifying equipment, such equipment or process tool processing the exposed surface of the substrate. Examples of such tools include tools for etching a substrate or tools for rendering the top surface substantially flat, such as CMP (Chemical Mechanical Planarization) tools.

A second type of equipment can be characterized as processing the substrate as a whole, or the bulk of the substrate. Such processing e.g. include thermal processing of the substrate or mechanical handling of a substrate. Typically, these bulk modifying tools may introduce mechanical stresses in the substrate resulting to strain, i.e. a deformation of the substrate.

It has been observed that the first type of equipment typically results in deformations of the alignment marks themselves, for example introducing mark asymmetries. The second type of equipment has been observed to result in actual deformations of the substrate as a whole, thus resulting in actual displacements of the alignment marks with respect to their expected or nominal position.

As such, in general, when a substrate is brought into a lithographic apparatus after being processed, both mark deformations and substrate deformations may have been introduced due to the processing.

International Patent Application Publication WO2017009166, which is incorporated herein in its entirety by reference, discloses separating mark deformation and wafer deformation by selecting and weighting the illumination color used for the measurements.

In particular, WO2017009166 discloses a generalized formulation linking alignment mark measurements to the different causes of alignment mark position deviations; deviations referring to the difference between a measured alignment mark position, i.e. an alignment mark position as derived from a measurement, and an actual alignment mark position. As a generalized formulation, the disclosure proposed to describe the positional deviations as observed (i.e. the differences between the measured alignment mark positions and the expected position) as a combination (e.g. a weighted combination, represented by a weight combination, or mixing matrix) of a substrate deformation function and one or more mark deformation functions. These functions may e.g. be discrete functions, describing the effects of a substrate deformation or mark deformation as a function of the (expected) mark position.

WO2017009166 disclosed that in the case when the columns of the mixing matrix are independent of each other, it can be shown that the pseudo-inverse matrix of the mixing matrix provides in a decomposition matrix that decomposes the alignment measurements into a substrate deformation that can be isolated from the mark deformations.

However, a problem was acknowledged in WO2017009166, that it may not be possible to obtain an accurate separation of the mark deformation functions. In the case that the column of the mixing matrix that is associated with the substrate deformation function is dependent on the other columns, it is not possible to separate the substrate deformation from the mark deformation.

WO2017009166 discloses some suggestions to alleviate such dependency including increasing the number of alignment measurements or alignment beam colors, or performing more specific alignment measurements.

However, the problem remains that there is not a clear separation between mark deformation and wafer deformation. Consequently, it is not possible to accurately determine whether fingerprint variations originate from mark deformations or substrate deformations. The non-varying part of mark deformation can be corrected using a conventional Advanced Process Control (APC) approach. Wafer-to-wafer variations of wafer deformation fingerprints are however not determined optimally by the color separation and weighting and APC approaches discussed above, in part because they only use color separation associated with mark deformation. Furthermore, PCA is not capable of arriving at the correct separations because of wrong intrinsic assumptions in the design of PCA, that do not map well on to the physics of deformation. A property of PCA is that the mathematical decomposition is orthogonal. However, physical processes with a different origin (like those causing wafer and mark deformation) are mostly not orthogonal.

SUMMARY

The inventors have devised a way to determine accurately whether process fingerprint variations originate from mark deformations or substrate deformations. It may be used for improving alignment, improving metrology and improved correction of a lithographic process, while avoiding or at least mitigating one or more of the associated problems mentioned above.

The invention in a first aspect provides a method for determining deformation, the method comprising:
(a) obtaining first measurement data associated with mark positions, from measurements of a plurality of substrates;
(b) obtaining second measurement data associated with mark positions, from measurements of the plurality of substrates;
(c) determining a mapping between the first measurement data and the second measurement data; and
(d) decomposing the mapping to separately determine a first deformation that scales differently from a second deformation in the mapping between the first and second measurement data.

The invention in a second aspect provides a method of aligning to a substrate comprising determining deformation according to the first aspect and aligning to the substrate based on the determined first deformation.

The invention in a third aspect provides a method of metrology of a substrate comprising determining deformation according to the first aspect and measuring the substrate based on the determined first deformation.

The invention in a fourth aspect provides a method of correcting a lithographic process comprising determining deformation according to the first aspect and correcting the lithographic process based on the determined first deformation.

The invention in a fifth aspect provides a computer program comprising computer readable instructions which, when run on suitable computer apparatus, cause the computer apparatus to perform the method of the first aspect.

The invention in a sixth aspect provides a computer program product comprising the computer program of the fifth aspect.

The invention in a seventh aspect provides an apparatus specifically adapted to carry out the steps of the method of the first, second third or fourth aspects.

BRIEF DESCRIPTION OF THE DRAWINGS/FIGURES

Embodiments of the invention will now be described, by way of example, with reference to the accompanying drawings in which:

FIG. 2 is a flowchart of lithographic process control including a method of determining deformation in accordance with the prior art.

FIG. 3 is a flowchart of lithographic process control including a method of determining deformation in accordance with an embodiment of the present invention.

DETAILED DESCRIPTION

Before describing embodiments of the invention in detail, it is instructive to present an example environment in which embodiments of the present invention may be implemented.

Figure 1:
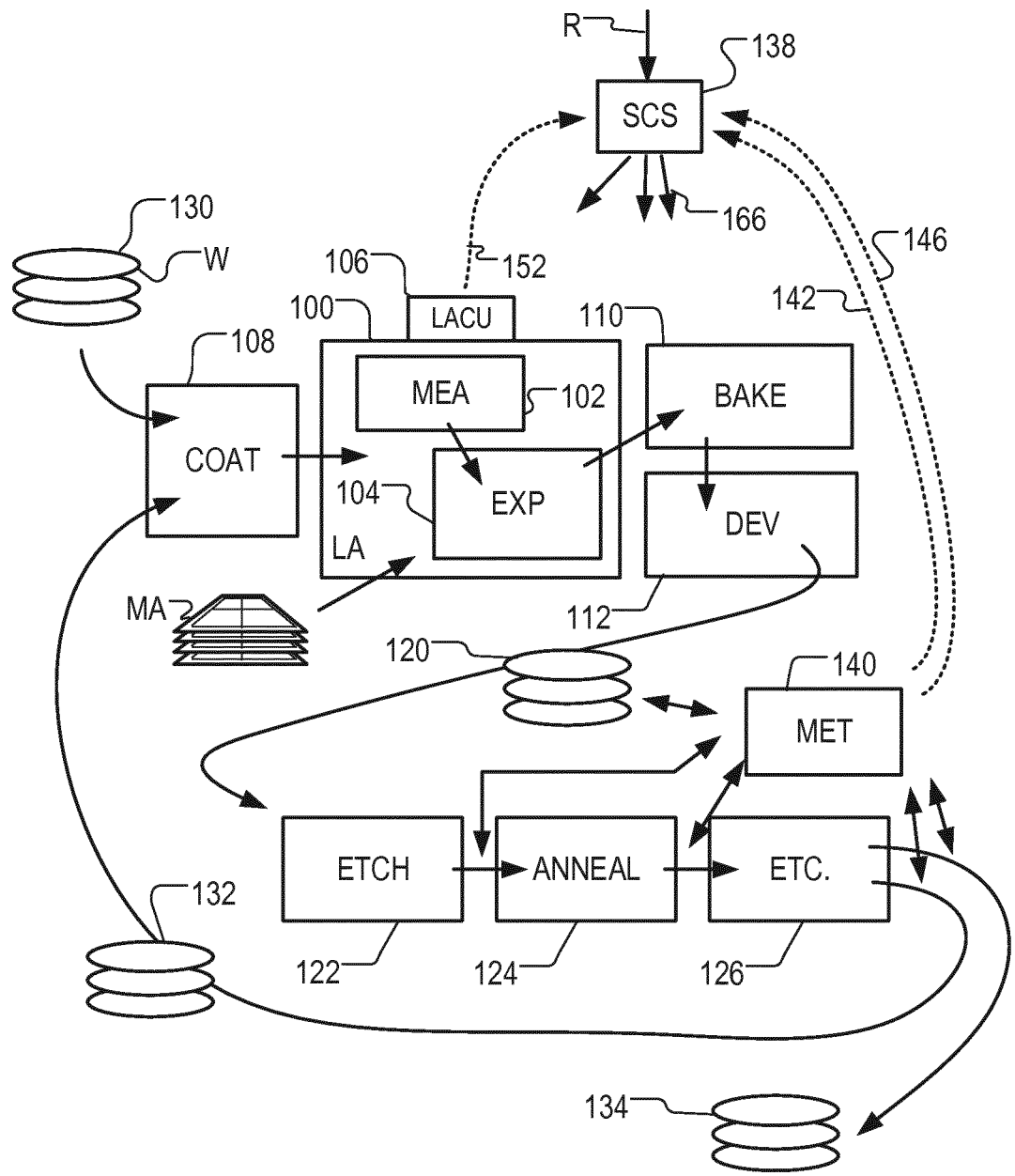
FIG. 1 depicts a lithographic apparatus together with other apparatuses forming a production facility for semiconductor devices.

FIG. 1 at 100 shows a lithographic apparatus LA as part of an industrial facility implementing a high-volume, lithographic manufacturing process. In the present example, the manufacturing process is adapted for the manufacture of for semiconductor products (integrated circuits) on substrates such as semiconductor wafers. The skilled person will appreciate that a wide variety of products can be manufactured by processing different types of substrates in variants of this process. The production of semiconductor products is used purely as an example which has great commercial significance today.

Within the lithographic apparatus (or "litho tool" 100 for short), a measurement station MEA is shown at 102 and an exposure station EXP is shown at 104. A control unit LACU is shown at 106. In this example, each substrate visits the measurement station and the exposure station to have a pattern applied. In an optical lithographic apparatus, for example, a projection system is used to transfer a product pattern from a patterning device MA onto the substrate using conditioned radiation and a projection system. This is done by forming an image of the pattern in a layer of radiation-sensitive resist material.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. The patterning MA device may be a mask or reticle, which imparts a pattern to a radiation beam transmitted or reflected by the patterning device. Well-known modes of operation include a stepping mode and a scanning mode. As is well known, the projection system may cooperate with support and positioning systems for the substrate and the patterning device in a variety of ways to apply a desired pattern to many target portions across a substrate. Programmable patterning devices may be used instead of reticles having a fixed pattern. The radiation for example may include electromagnetic radiation in the deep ultraviolet (DUV) or extreme ultraviolet (EUV) wavebands. The present disclosure is also applicable to other types of lithographic process, for example imprint lithography and direct writing lithography, for example by electron beam.

The lithographic apparatus control unit LACU controls all the movements and measurements of various actuators and sensors, causing the apparatus to receive substrates W and reticles MA and to implement the patterning operations. LACU also includes signal processing and computing capacity to implement desired calculations relevant to the operation of the apparatus. In practice, control unit LACU will be realized as a system of many sub-units, each handling the real-time data acquisition, processing and control of a subsystem or component within the apparatus.

Before the pattern is applied to a substrate at the exposure station EXP, the substrate is processed in at the measurement station MEA so that various preparatory steps may be carried out. The preparatory steps may include mapping the surface height of the substrate using a level sensor and measuring the position of alignment marks on the substrate using an alignment sensor. The alignment marks are arranged nominally in a regular grid pattern. However, due to inaccuracies in creating the marks and also due to deformations of the substrate that occur throughout its processing, the marks deviate from the ideal grid. Consequently, in addition to measuring position and orientation of the substrate, the alignment sensor in practice must measure in detail the positions of many marks across the substrate area, if the apparatus is to print product features at the correct locations with very high accuracy.

The lithographic apparatus LA may be of a so-called dual stage type which has two substrate tables, each with a positioning system controlled by the control unit LACU. While one substrate on one substrate table is being exposed at the exposure station EXP, another substrate can be loaded onto the other substrate table at the measurement station MEA so that various preparatory steps may be carried out. The measurement of alignment marks is therefore very time-consuming and the provision of two substrate tables enables a substantial increase in the throughput of the apparatus. If the position sensor IF is not capable of measuring the position of the substrate table while it is at the measurement station as well as at the exposure station, a second position sensor may be provided to enable the positions of the substrate table to be tracked at both stations. When lithographic apparatus LA is of a so-called dual stage type which has two substrate tables, the exposure station and the measurement station may be distinct locations between which the substrate tables can be exchanged. This is only one possible arrangement, however, and the measurement station and exposure station need not be so distinct. For example, it is known to have a single substrate table, to which a measurement stage is temporarily coupled during the pre-exposure measuring phase. The present disclosure is not limited to either type of system.

Within the production facility, apparatus 100 forms part of a "litho cell" or "litho cluster" that contains also a coating apparatus 108 for applying photosensitive resist and other coatings to substrates W for patterning by the apparatus 100. At an output side of apparatus 100, a baking apparatus 110 and developing apparatus 112 are provided for developing the exposed pattern into a physical resist pattern. Between all of these apparatuses, substrate handling systems take care of supporting the substrates and transferring them from one piece of apparatus to the next. These apparatuses, which are often collectively referred to as the "track", are under the control of a track control unit which is itself controlled by a supervisory control system SCS, which also controls the lithographic apparatus via lithographic apparatus control unit LACU. Thus, the different apparatuses can be operated to maximize throughput and processing efficiency. Supervisory control system SCS receives recipe information R which provides in great detail a definition of the steps to be performed to create each patterned substrate.

Once the pattern has been applied and developed in the litho cell, patterned substrates 120 are transferred to other processing apparatuses such as are illustrated at 122, 124, 126. A wide range of processing steps is implemented by various apparatuses in a typical manufacturing facility. For the sake of example, apparatus 122 in this embodiment is an etching station, and apparatus 124 performs a post-etch annealing step. Further physical and/or chemical processing steps are applied in further apparatuses, 126, etc. Numerous types of operation can be required to make a real device, such as deposition of material, modification of surface material characteristics (oxidation, doping, ion implantation etc.), chemical-mechanical polishing (CMP), and so forth. The apparatus 126 may, in practice, represent a series of different processing steps performed in one or more apparatuses.

As is well known, the manufacture of semiconductor devices involves many repetitions of such processing, to build up device structures with appropriate materials and patterns, layer-by-layer on the substrate. Accordingly, substrates 130 arriving at the litho cluster may be newly prepared substrates, or they may be substrates that have been processed previously in this cluster or in another apparatus entirely. Similarly, depending on the required processing, substrates 132 on leaving apparatus 126 may be returned for a subsequent patterning operation in the same litho cluster, they may be destined for patterning operations in a different cluster, or they may be finished products to be sent for dicing and packaging.

Each layer of the product structure requires a different set of process steps, and the apparatuses 126 used at each layer may be completely different in type. Further, even where the processing steps to be applied by the apparatus 126 are nominally the same, in a large facility, there may be several supposedly identical machines working in parallel to perform the step 126 on different substrates. Small differences in set-up or faults between these machines can mean that they influence different substrates in different ways. Even steps that are relatively common to each layer, such as etching (apparatus 122) may be implemented by several etching apparatuses that are nominally identical but working in parallel to maximize throughput. In practice, moreover, different layers require different etch processes, for example chemical etches, plasma etches, according to the details of the material to be etched, and special requirements such as, for example, anisotropic etching.

The previous and/or subsequent processes may be performed in other lithography apparatuses, as just mentioned, and may even be performed in different types of lithography apparatus. For example, some layers in the device manufacturing process which are very demanding in parameters such as resolution and overlay may be performed in a more advanced lithography tool than other layers that are less demanding. Therefore some layers may be exposed in an immersion type lithography tool, while others are exposed in a 'dry' tool. Some layers may be exposed in a tool working at DUV wavelengths, while others are exposed using EUV wavelength radiation.

In order that the substrates that are exposed by the lithographic apparatus are exposed correctly and consistently, it is desirable to inspect exposed substrates to measure properties such as overlay errors between subsequent layers, line thicknesses, critical dimensions (CD), etc. Accordingly a manufacturing facility in which litho cell LC is located also includes metrology system MET which receives some or all of the substrates W that have been processed in the litho cell. Metrology results are provided directly or indirectly to the supervisory control system (SCS) 138. If errors are detected, adjustments may be made to exposures of subsequent substrates, especially if the metrology can be done soon and fast enough that other substrates of the same batch are still to be exposed. Also, already exposed substrates may be stripped and reworked to improve yield, or discarded, thereby avoiding performing further processing on substrates that are known to be faulty. In a case where only some target portions of a substrate are faulty, further exposures can be performed only on those target portions which are good.

Also shown in FIG. 1 is a metrology apparatus 140 which is provided for making measurements of parameters of the products at desired stages in the manufacturing process. A common example of a metrology apparatus in a modern lithographic production facility is a scatterometer, for example an angle-resolved scatterometer or a spectroscopic scatterometer, and it may be applied to measure properties of the developed substrates at 120 prior to etching in the apparatus 122. Using metrology apparatus 140, it may be determined, for example, that important performance parameters such as overlay or critical dimension (CD) do not meet specified accuracy requirements in the developed resist. Prior to the etching step, the opportunity exists to strip the developed resist and reprocess the substrates 120 through the litho cluster. As is also well known, the metrology results 142 from the apparatus 140 can be used to maintain accurate performance of the patterning operations in the litho cluster, by supervisory control system SCS and/or control unit LACU 106 making small adjustments 166 over time, thereby minimizing the risk of products being made out-of-specification, and requiring re-work. Of course, metrology apparatus 140 and/or other metrology apparatuses (not shown) can be applied to measure properties of the processed substrates 132, 134, and incoming substrates 130.

FIG. 2 is a flowchart of lithographic process control including a method of determining deformation in accordance with the prior art.

At step 202, substrates are exposed with alignment marks (or overlay targets). Patterned substrates 204 are subjected to etch processing 206, which causes substrates 208 to have alignment mark (or overlay target) deformations (MD). The substrates 208 are then subjected to thermal processing 210, which causes substrates 212 to have both alignment mark (or overlay target) deformations (MD) and substrate deformations (SD). At a align step 214, measurements of substrates produce an alignment measurement dataset 216. Alternatively, step 214 may be a metrology step where measurements of substrates produce an overlay measurement dataset 216.

At step 218 orthogonal decomposition is used to obtain fingerprints 220. As mentioned above, a problem with orthogonal decomposition (such as using PCA) is that physical processes with a different origin (like those causing substrate and mark deformation) are mostly not orthogonal. The fingerprints 220 therefore can represent mixed mark and substrate deformations. At step 222, the fingerprints 220 are used to correct alignment, metrology or process tool settings.

FIG. 3 is a flowchart of lithographic process control including a method of determining deformation in accordance with an embodiment of the present invention.

At step 302, substrates are exposed with alignment marks (or overlay targets). Patterned substrates 304 are subjected to etch processing 306, which causes substrates 308 to have alignment mark (or overlay target) deformations (MD). The substrates 308 are then subjected to thermal processing 310, which causes substrates 312 to have both alignment mark (or overlay target) deformations (MD) and substrate deformations (SD). At a align step 314, measurements of substrates produce alignment measurement datasets 316. Alternatively, step 314 may be a metrology step where measurements of substrates produce overlay measurement datasets 316.

At step 318 decomposition of mapping matrices is used to obtain fingerprints 320. A mapping ($M_{i,j}$) between a first measurement dataset and a second measurement dataset is decomposed to separately determine a first deformation 320 (mark deformation fingerprints) that scales differently from a second deformation 322 (substrate deformation fingerprints) in the mapping between the datasets 316. At step 324, the mark deformation fingerprints 320 are used to correct alignment, metrology or process tool settings. At step 326, the substrate deformation fingerprints 322 may also be used to correct alignment, metrology or process tool settings. Steps 314 to 322 are described in more detail below with reference to FIGS. 4 and 5.

A blind source algorithm is provided that is able to achieve a clear separation between mark deformation and wafer deformation. This may be used to improve on the measurement errors for both wafer alignment (in a lithography apparatus) and overlay (in a metrology apparatus).

The algorithm also manages to separate individual mark deformation component fingerprints. This can be used not only for diagnostics but also in the fab feedback control environment to directly optimize process tool settings for specific tools.

Embodiments use the shape properties of mark deformation, i.e. wafer distributions, to separate substrate deformation and individual mark deformation components. The shapes, which originate from different process equipment, are expected to be present in any new substrate to be exposed after the training has finished. A training is performed on a limited set of wafers to create the set of shapes which independently contribute to the alignment or overlay signals.

Consideration of the underlying physics suggests a 3D problem with the following properties:

$$X_{color}(wafer, par) = \sum_{comp} U_{comp}(wafer) \cdot W_{comp}(color) \cdot V_{comp}(par)$$

where X is the measured dataset for a given color (or overlay), which is a function of the wafer number and the parameter number in a model of the data. X is a sum of components, where the variables are separated between the dependency on wafer ($U_{comp}$), dependency on color ($W_{comp}$) and dependency on model parameter ($V_{comp}$). It is expected that all datasets for all colors have the same shapes. The shapes are expected to scale for a certain component differently for the different colors, but the shapes are expected to have a common scoring per wafer (how strong this particular component is present on a particular wafer).

In embodiments, blind source separation is used for the 3-fold separation of variables U, W and V. In conventional blind source separation, there is a 2-fold separation. The extra dimension here is the colors. The 3-fold separation of variables arises from an appreciation of the physics revealing that identical shapes with constant color ratios are expected for all wafers.

Non-orthogonal decomposition is used because mark deformations are not orthogonal in shape and color behavior. Optimal dimensionality reduction is used because the components should match with physical effects one-on-one.

A decomposition of the dataset into shapes is provided such that they map properly between the different sets (per color or overlay data), simply by means of scaling.

When the mapping between different datasets is decomposed into these shapes, the same score value is found for the different colors. Eigenvalue decomposition provides the way to decompose the datasets into matching shapes.

To be able to do eigenvalue decomposition a square matrix is needed. The dataset is not square because there is a different number of wafers from parameters. However, the mapping between the datasets are square. They have a number of rows and columns that is the same as the number of parameters.

The purpose of the mapping matrix is to establish the correlation between two datasets. In particular, the mapping matrices provide a mapping between the different colors (e.g. between red and green) or mapping between color and overlay (e.g. between red and overlay). The mapping matrices are decomposed into an eigenvalue decomposition that forces a mapping from identical shapes to identical shapes.

Thus embodiments of the present invention are based on mapping matrices rather than dataset itself. Real-valued eigenvalue decomposition is used on a model mapping matrix. A multiple of these decompositions may be performed.

Figure 4:
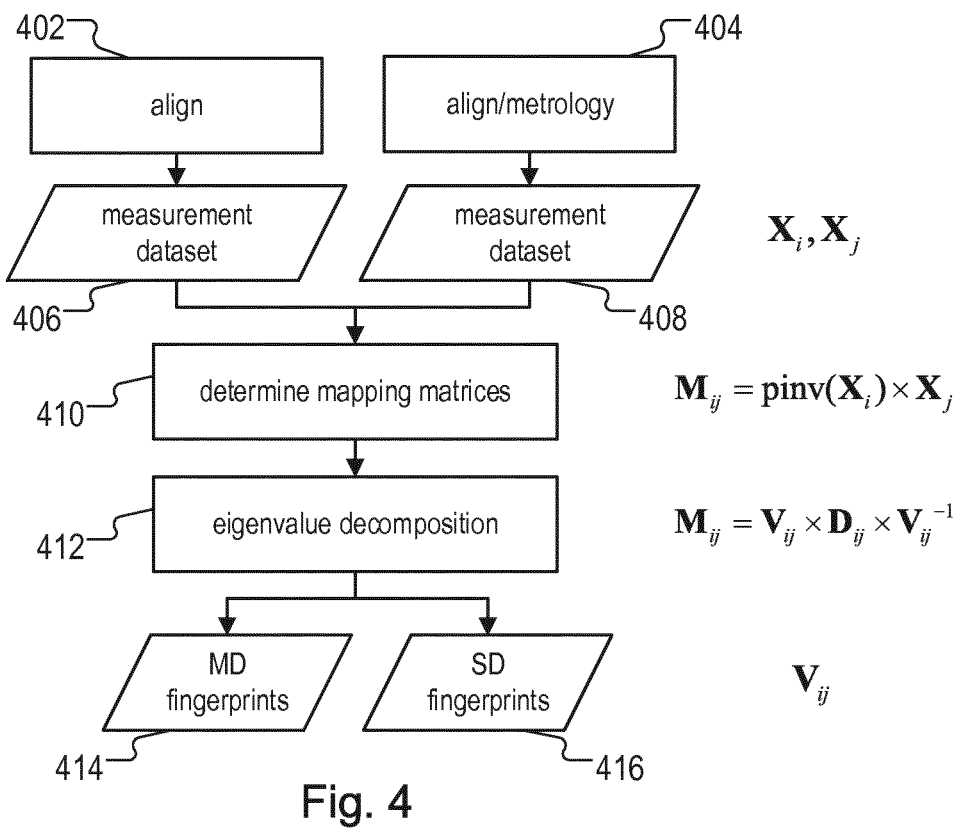
FIG. 4 is a flowchart of a method of determining deformation in accordance with an embodiment of the present invention.

FIG. 4 is a flowchart of a method of determining deformation in accordance with an embodiment of the present invention.

With reference to FIG. 4, the method includes the steps:

Step 402: obtaining first measurement data 406 ($X_i$) associated with mark position, from measurements of a plurality of wafer substrates. The first measurement data is obtained by measurement of position of a plurality of features across the plurality of substrates using an optical metrology system illuminating with a first color. For example, a first measurement dataset $X_i$ is obtained from alignment measurements of all wafers in a training set using a single color, e.g. red, green, near infrared (nir) and far infrared (fir). Thus, examples of the first data set $X_i$ are $X_{red}$, $X_{green}$, $X_{nir}$ and $X_{fir}$. Each color has a separate matrix. The first measurement dataset $X_i$ has a size $n_{wafers} \times n_{model-parameters}$. It is beneficial to express the datasets in model parameters, like high order wafer alignment parameters or standard models based on 6 parameters.

In another embodiment, the first measurement data may be obtained by measurement with a first plurality of colors. So, for example $X_i$ may include a combination of one or more of $X_{red}$, $X_{green}$, $X_{nir}$ and $X_{fir}$.

Step 404: obtaining second measurement data 408 ($X_j$ and/or Y) associated with mark position, from measurements of the plurality of substrates. The second measurement data is obtained by measurement of position of a plurality of features across the plurality of substrates using an optical metrology system illuminating with a second color.

For example, a second measurement dataset $X_j$ may be obtained from alignment measurements of all wafers in the training set using a different single color from the first dataset $X_i$, e.g. red, green, near infrared (nir) and far infrared (fir). The second measurement dataset $X_j$ has a size $n_{wafers} \times n_{model-parameters}$.

In other embodiments, the second measurement data may be obtained by measurement with a second plurality of colors, different from the first plurality of colors.

In addition or alternatively, the second measurement data Y may be obtained from overlay measurements of all wafers in the training set. In this case, the second measurement dataset Y has a size $n_{wafers} \times n_{overlay-parameters}$. Thus, in this case the first measurement data is obtained by alignment to marks and the second measurement data may be obtained by metrology of the marks.

In another embodiment, first measurement data is obtained by measurement of the substrate, for example wafer leveling (height) measurements and the second measurement data is obtained by metrology of the substrate.

Step 410: determining a mapping between the first measurement data and the second measurement data. This involves determining a mapping matrix $M_{ij}$ representing correlation between the first $X_i$ and second $X_j$ (and/or Y) measurement data. The mapping matrix $M_{ij}$ may be determined by calculating a pseudoinverse of the first measurement data $X_i$. Conventional approaches involve decomposing the wafer alignment and/or overlay measurement datasets themselves. In contrast, embodiments of the present invention decompose the mapping matrices between the datasets. As mentioned above, the mapping matrix is a square matrix; M is $n_{params} \times n_{params}$. These mapping matrices establish the full correlation between the datasets. They may be defined by:

$$X_j \approx X_i \times M_{ij} \Rightarrow M_{ij} = \text{pinv}(X_i) \times X_j$$

where $X_i$ and $X_j$ denote the training wafer dataset of a specific color; and $$Y \approx X \times M \Rightarrow M = \text{pinv}(X) \times Y$$

where X and Y denote the training wafer dataset of a specific color and of overlay respectively.

Overlay can be measured with different colors, therefore Y may be represented by $Y_k$ where k denotes the overlay measurement color:

$$Y_k \approx X_i \times M_{ik} \Rightarrow M_{ik} = \text{pinv}(X_i) \times Y_k$$

Various mappings are possible, for example a mapping from color to color:

$$X_{green} \approx X_{red} \times M_b \Rightarrow M_b = \text{pinv}(X_{red}) \times X_{green}$$

or for example a mapping from wafer align to overlay for one color:

$$Y \approx X_{red} \times M_a \Rightarrow M_a = \text{pinv}(X_{red}) \times Y$$

or for example a mapping from a plurality of alignment colors to overlay at once:

$$\begin{pmatrix} Y \\ Y \\ Y \\ Y \end{pmatrix} = \begin{pmatrix} X_{red} \\ X_{green} \\ X_{nir} \\ X_{fir} \end{pmatrix} \times M_c \Rightarrow M_c = \text{pinv} \begin{pmatrix} X_{red} \\ X_{green} \\ X_{nir} \\ X_{fir} \end{pmatrix} \times \begin{pmatrix} Y \\ Y \\ Y \\ Y \end{pmatrix}$$

where $M_a$, $M_b$ and $M_c$ are different mapping matrices.

Figure 5:
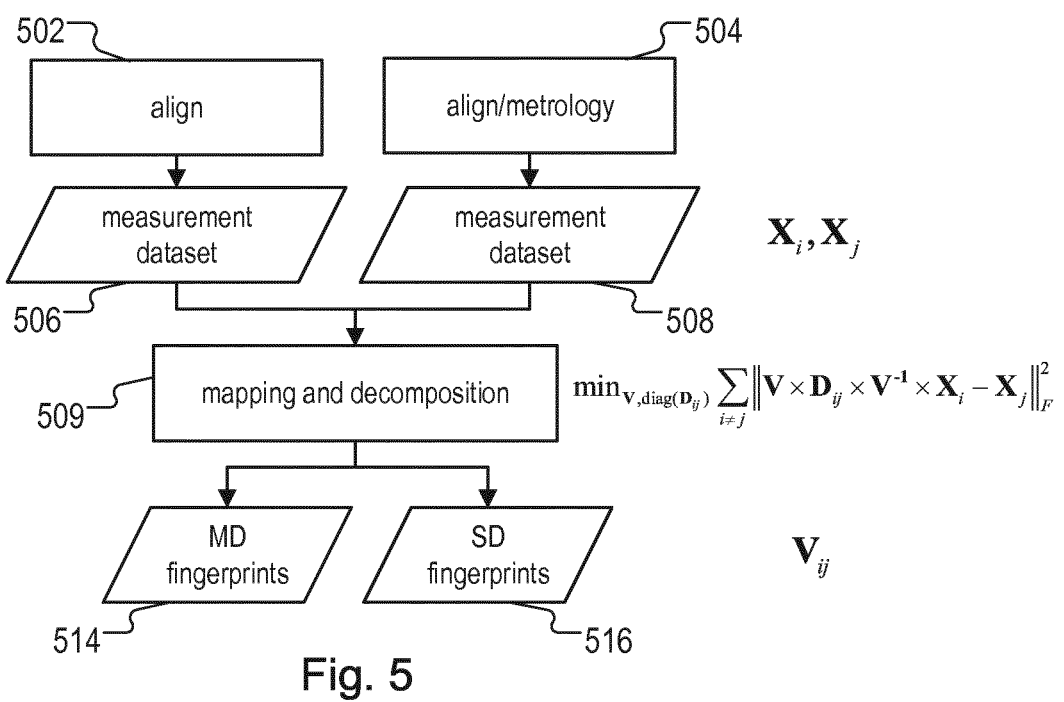
FIG. 5 is a flowchart of a method of determining deformation in accordance with another embodiment of the present invention.

Although FIGS. 4 and 5 are described in relation to the example of data sets $X_i$ and $X_j$, it should be appreciated that the embodiments may use various combinations of data sets, including X and Y or $X_i$ and $Y_k$ or combinations of the other data sets described above.

Step 412: decomposing the mapping to separately determine a first deformation 414 (e.g. MD or SD) that scales differently from a second deformation 416 (e.g. SD or MD) in the mapping between the datasets. The decomposing comprises calculating an eigenvalue decomposition for the mapping matrix $M_{ij}$ and using eigenvalues in an eigenvalue matrix $D_{ij}$ representing different scaling to identify one or more eigenvectors $V_{ij}$ that represent the first deformation (e.g. MD or SD). The decomposition may be represented in general as:

$$M = V \times D \times V^{-1}$$

or for example $$M_{ij} = V_{ij} \times D_{ij} \times V_{ij}^{-1}$$

where $V_{ij}$ can be considered as the shape decomposition matrix representing the deformations, $D_{ij}$ is a diagonal matrix containing the eigenvalues, and $V_{ij}^{-1}$ is the matrix that contains the shapes. This can be regarded as the mapping matrix M being decomposed into shapes, the shapes are scaled with a coordinate transformation and decomposed back again to the original coordinates. This corresponds to the underlying physical effects, where there are shapes that are common in $X_i$ and $X_j$ (or Y) but have different magnitudes. The deformations $V_{ij}$ may be non-orthogonal.

An advantage of this eigenvalue decomposition is that it automatically splits MD and SD due to different eigenvalues. It automatically performs "shape matching" while maintaining full correlation. It is also useful that the decomposition matrix is non-orthonormal A potential problem is that the eigenvalue decomposition often is complex-valued. This can be overcome by using 2×2 off-diagonal submatrices in the eigenvalue matrix $(D_{ij})$ in order to convert complex-eigenvalue decomposition to a real-eigenvalue decomposition.

If the data contains only clean mark and wafer deformation, thus no noise or other signal components, each pair of data sets would essentially result in the same decomposition matrix $V_{ij}$. In practice however there will be noise and other components in the data. Therefore mapping matrices of multiple dataset pairs may be combined to improve on noise by averaging, resulting in a single set of shapes.

After eigenvalue decomposition, we expect eigenvalues for mark deformation mapping from one alignment color to another to be non-zero and fluctuating from color to color. We can assume that the overlay measurement does not contain mark deformation, but we expect substrate deformation to be present in the overlay measurement. Mapping from overlay data which is free from mark deformation, we expect to have an eigenvalue of zero. Some specific examples are:

Substrate deformation has eigenvalue 1;
Mark deformation has eigenvalue 0, when mapping from wafer align to overlay; and
Mark deformation has varying eigenvalue, when mapping from one wafer align color to another wafer align color.

These properties of the eigenvalues have the following consequences:

Separation of substrate deformation and mark deformation by mapping from wafer align to overlay is possible;
Separation of substrate deformation and mark deformation by mapping from color to color is possible;
Separation of individual substrate deformation types not possible as they have the same eigenvalue;
Separation of individual mark deformation types is only possible when mapping from wafer align color to color; and
Wafer align reproduction, mark print error and "Colorless" mark deformation (that is insensitive to alignment color) can only be separated from substrate deformation by mapping from wafer align to overlay.

Based on the eigenvalues, to separately determine a first deformation 412 (e.g. MD fingerprint) that scales differently from a second deformation 414 (e.g. SD fingerprint) in the mapping between the datasets.

Corresponding to step 324 in FIG. 3, the determined MD fingerprint can be used to correct alignment, metrology and process settings.

For example, alignment to a substrate may be based on the MD fingerprint determined from a training set of wafers.

For improved metrology, the settings for measuring a substrate may be based on based on the MD fingerprint determined from a training set of wafers.

For improved process control, corrections may be made to a lithographic process based on the MD fingerprint determined from a training set of wafers.

FIG. 5 is a flowchart of a method of determining deformation in accordance with another embodiment of the present invention. With reference to FIG. 5, as an alternative to eigenvalue decomposition, a process described as eigenvalue optimization can be used. In this embodiment, the matrix coefficients of $D_{ij}$ and V are optimized to minimize the mapping matrix residuals.

In FIG. 5, steps 502 to 508 and 514 to 516 are the same as steps 402 to 408 and 414 to 416 described with reference to FIG. 4.

At step 509, the steps of determining a mapping and decomposing the mapping are performed together using non-linear optimization. Rather than calculating mapping matrices, combining them and calculating an eigenvalue decomposition separately as described with reference to FIG. 4, the mapping and decomposition can also be done in one step by a non-linear optimization algorithm:

$$\min_{V, diag(D_{ij})} \sum_{i \neq j} \|V \times D_{ij} \times V^{-1} \times X_i - X_j\|_F^2.$$

The decomposing may further comprise constraining eigenvalues of the eigenvalue matrix $D_{ij}$ to separately determine eigenvectors representing the first deformation $V_{ij}$. The constraining may use regularization to penalize deviation from a desired eigenvalue. The decomposing may further comprise adding non-zero off-diagonal terms to the eigenvalue matrix $D_{ij}$.

With reference to the embodiments described with reference to FIGS. 4 and 5, since mark deformation and wafer deformation scale differently between alignment colors and between alignment and overlay, the eigenvalue decomposition or optimization algorithm naturally results in a separation of these components.

Embodiments of the present invention allow for a more complete and accurate blind source separation of wafer deformation and individual mark deformation components.

This separation can be used to improve on mark deformation impact on both wafer alignment and overlay measurements.

Embodiments make full use of all wafer alignment data in combination with more sparsely available overlay data to come to a better data decomposition.

Furthermore, this decomposition can be used as a feedback control in the optimization process of wafer processing tools.

It can also help to facilitate better visualization and understanding of mark deformation effects.

An embodiment of the invention may be implemented using a computer program containing one or more sequences of computer readable instructions describing methods of determining deformation, as described above. This computer program may be executed within a computer apparatus, such as control unit LACU of FIG. 1, or some other controller. There may also be provided a data storage medium (e.g., semiconductor memory, magnetic or optical disk) having such a computer program stored therein.

Figure 6:
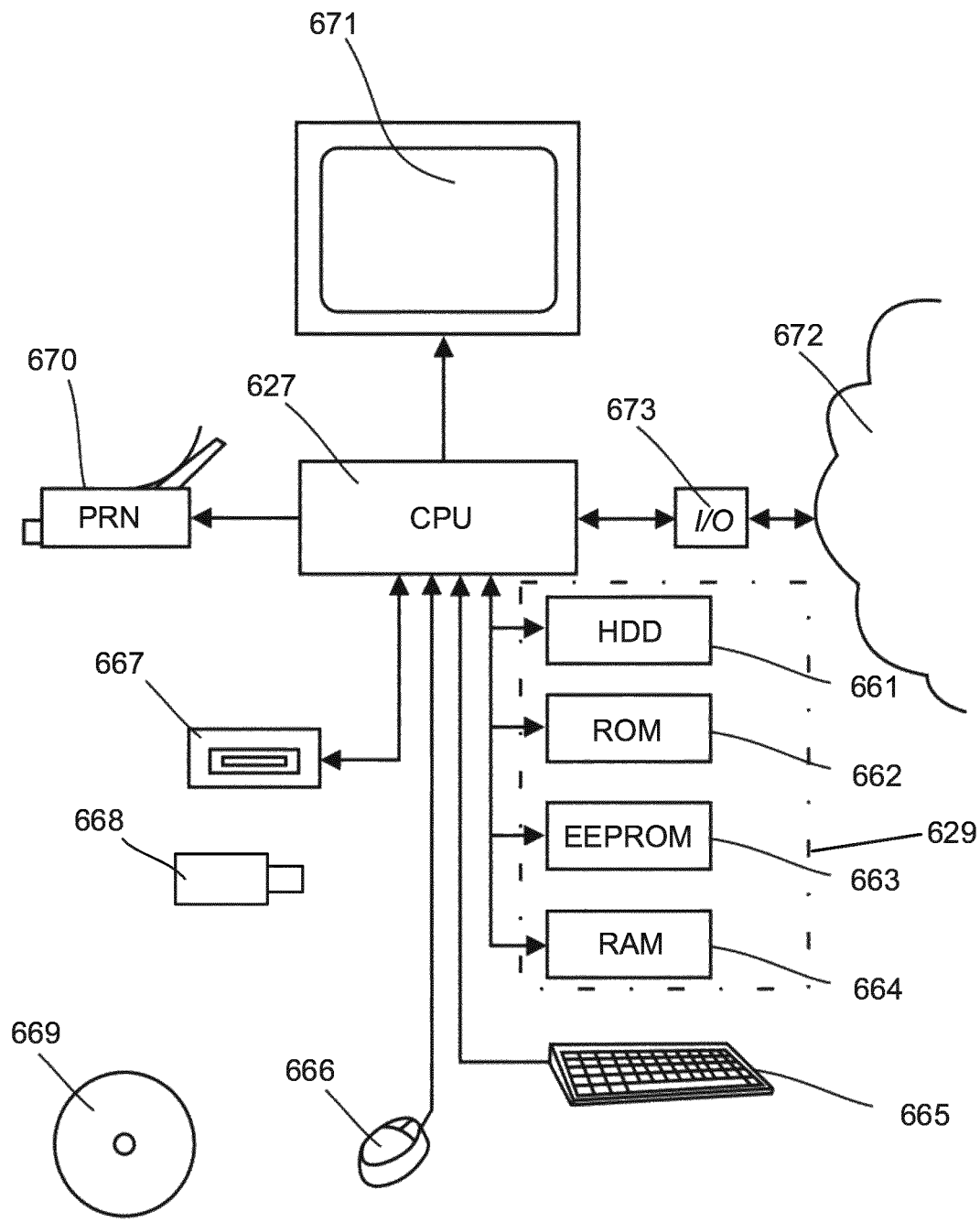
FIG. 6 illustrates computing apparatus hardware useful in implementing the methods disclosed herein.

This control unit LACU may include a computer assembly as shown in FIG. 6. The computer assembly may be a dedicated computer in the form of a control unit in embodiments of the assembly according to the invention or, alternatively, be a central computer controlling the lithographic apparatus. The computer assembly may be arranged for loading a computer program product comprising computer executable code. This may enable the computer assembly, when the computer program product is downloaded, to control aforementioned uses of a lithographic apparatus with embodiments of the level and alignment sensors AS, LS.

Memory 629 connected to processor 627 may comprise a number of memory components like a hard disk 661, Read Only Memory (ROM) 662, Electrically Erasable Programmable Read Only Memory (EEPROM) 663 and Random Access Memory (RAM) 664. Not all aforementioned memory components need to be present. Furthermore, it is not essential that aforementioned memory components are physically in close proximity to the processor 627 or to each other. They may be located at a distance away.

The processor 627 may also be connected to some kind of user interface, for instance a keyboard 665 or a mouse 666. A touch screen, track ball, speech converter or other interfaces that are known to persons skilled in the art may also be used.

The processor 627 may be connected to a reading unit 667, which is arranged to read data, e.g. in the form of computer executable code, from and under some circumstances store data on a data carrier, like a solid-state drive 668 or a CDROM 669. Also DVD's or other data carriers known to persons skilled in the art may be used.

The processor 627 may also be connected to a printer 670 to print out output data on paper as well as to a display 671, for instance a monitor or LCD (Liquid Crystal Display), of any other type of display known to a person skilled in the art.

The processor 627 may be connected to a communications network 672, for instance a public switched telephone network (PSTN), a local area network (LAN), a wide area network (WAN) etc. by means of transmitters/receivers 673 responsible for input/output (I/O). The processor 627 may be arranged to communicate with other communication systems via the communications network 672. In an embodiment of the invention external computers (not shown), for instance personal computers of operators, can log into the processor 627 via the communications network 672.

The processor 627 may be implemented as an independent system or as a number of processing units that operate in parallel, wherein each processing unit is arranged to execute sub-tasks of a larger program. The processing units may also be divided in one or more main processing units with several sub-processing units. Some processing units of the processor 627 may even be located a distance away of the other processing units and communicate via communications network 672. Connections between modules can be made wired or wireless.

The computer system can be any signal processing system with analogue and/or digital and/or software technology arranged to perform the functions discussed here.

Further embodiments of the disclosure are disclosed in the list of numbered embodiments below:

1. A method for determining deformation, the method comprising:
   (a) obtaining (402, 502) first measurement data ($X_i$) associated with mark positions, from measurements of a plurality of substrates;
   (b) obtaining (404, 504) second measurement data ($X_j$ and/or Y) associated with mark positions, from measurements of the plurality of substrates;
   (c) determining (408, 509) a mapping ($M_{i,j}$) between the first measurement data and the second measurement data; and
   (d) decomposing (410, 509) the mapping to separately determine a first deformation (e.g. MD or SD) that scales differently from a second deformation (e.g. SD or MD) in the mapping between the first and second measurement data.
2. The method of embodiment 1, wherein determining the mapping (408, 508) comprises determining a mapping matrix ($M_{ij}$) representing correlation between the first and second measurement data.

3. The method of embodiment 2 wherein determining a mapping matrix ($M_{ij}$) comprises calculating a pseudoinverse of the first measurement data (402, 502) ($X_i$).
4. The method of embodiment 2 or embodiment 3, wherein the step of decomposing comprises calculating an eigenvalue decomposition for the mapping matrix ($M_{ij}$) and using eigenvalues in an eigenvalue matrix ($D_{ij}$) representing different scaling to identify one or more eigenvectors ($V_{ij}$) that represent the first deformation (MD).
5. The method of embodiment 4, further comprising using [2×2] off-diagonal submatrices in the eigenvalue matrix ($D_{ij}$) in order to convert complex-eigenvalue decomposition to a real-eigenvalue decomposition.
6. The method of embodiment 4, wherein the eigenvectors ($V_{ij}$) are non-orthogonal.
7. The method of any preceding embodiment, wherein the steps of determining a mapping and decomposing the mapping are performed together using non-linear optimization (509).
8. The method of embodiment 7 wherein the step of decomposing further comprises constraining eigenvalues of the eigenvalue matrix ($D_{ij}$) to separately determine eigenvectors representing the first deformation ($V_{ij}$).
9. The method of embodiment 8 wherein the step of constraining comprises using regularization to penalize deviation from a desired eigenvalue.
10. The method of any of embodiments 7 to 9 wherein the step of decomposing further comprises adding non-zero off-diagonal terms to the eigenvalue matrix ($D_{ij}$).
11. The method of any preceding embodiment, wherein the first measurement data is obtained by measurement (ALN) of position of a plurality of features across the plurality of substrates using an optical metrology system illuminating with a first color and the second measurement data is obtained by measurement (ALN, YS) of position of a plurality of features across the plurality of substrates using an optical metrology system illuminating with a second color.
12. The method of any preceding embodiment, wherein the first measurement data is obtained by measurement (ALN) with a first plurality of colors and the second measurement data is obtained by measurement (ALN, YS) with a second plurality of colors.
13. The method of any preceding embodiment, wherein first measurement data is obtained by alignment to marks (ALN) and the second measurement data is obtained by metrology of the marks (YS).
14. The method of any preceding embodiment, wherein first measurement data is obtained by measurement of the substrate (levelling) and the second measurement data is obtained by metrology of the substrate (YS).
15. A method of aligning to a substrate comprising determining deformation according to any preceding embodiment and aligning to the substrate based on the determined first deformation.
16. A method of metrology of a substrate comprising determining deformation according to any of embodiments 1 to 14 and measuring the substrate based on the determined first deformation.
17. A method of correcting a lithographic process comprising determining deformation according to any of embodiments 1 to 14 and correcting the lithographic process based on the determined first deformation.
18. A computer program comprising computer readable instructions which, when run on suitable computer apparatus, cause the computer apparatus to perform the method according to any of embodiments 1 to 17.
19. A computer program product comprising the computer program of embodiment 18.
20. An apparatus specifically adapted to carry out the steps of the method according to any of embodiments 1 to 17.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description by example, and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

The invention claimed is:

1. A method for determining deformation, the method comprising:
    obtaining first measurement data associated with mark positions, from measurements of a plurality of substrates;
    obtaining second measurement data associated with mark positions, from measurements of the plurality of substrates;
    determining a mapping between the first measurement data and the second measurement data; and
    decomposing, by a hardware computer system, the mapping to separately determine a first deformation that scales differently from a second deformation in the mapping between the first and second measurement data.
2. The method of claim 1, wherein determining the mapping comprises determining a mapping matrix representing correlation between the first and second measurement data.
3. The method of claim 2, wherein determining a mapping matrix comprises calculating a pseudoinverse of the first measurement data.
4. The method of claim 2, wherein the decomposing comprises calculating an eigenvalue decomposition for the mapping matrix and using eigenvalues in an eigenvalue matrix representing different scaling to identify one or more eigenvectors that represent the first deformation.
5. The method of claim 4, wherein the eigenvectors are non-orthogonal.
6. The method of claim 1, wherein the determining a mapping and decomposing the mapping are performed together using non-linear optimization.
7. The method of claim 6, wherein the decomposing further comprises constraining eigenvalues of an eigenvalue matrix to separately determine eigenvectors representing the first deformation.
8. The method of claim 1, wherein the first measurement data is obtained by measurement of position of a plurality of features across the plurality of substrates using an optical metrology system illuminating with a first color and the second measurement data is obtained by measurement of position of a plurality of features across the plurality of substrates using an optical metrology system illuminating with a second color.

9. The method of claim 1, wherein the first measurement data is obtained by measurement with a first plurality of colors and the second measurement data is obtained by measurement with a second plurality of colors.

10. The method of claim 1, wherein first measurement data is obtained by alignment to marks and the second measurement data is obtained by metrology of the marks.

11. A method of aligning to a substrate, the method comprising determining deformation according to claim 1 and aligning to the substrate based on the determined first deformation.

12. A method of metrology of a substrate, the method comprising determining deformation according to claim 1 and measuring the substrate based on the determined first deformation.

13. A method of correcting a lithographic process, the method comprising determining deformation according to claim 1 and correcting the lithographic process based on the determined first deformation.

14. A computer program product comprising a non-transitory computer-readable medium having computer readable instructions therein, the instructions, upon execution by a computer apparatus, configured to cause the computer apparatus to at least:
obtain first measurement data associated with mark positions, from measurements of a plurality of substrates;
obtain second measurement data associated with mark positions, from measurements of the plurality of substrates;
determine a mapping between the first measurement data and the second measurement data; and
decompose the mapping to separately determine a first deformation that scales differently from a second deformation in the mapping between the first and second measurement data.

15. The computer program product of claim 14, wherein the instructions configured to cause the computer apparatus to determine the mapping are further configured to cause the computer apparatus to determine a mapping matrix representing correlation between the first and second measurement data.

16. The computer program product of claim 15, wherein the instructions configured to cause the computer apparatus to determine the mapping are further configured to cause the computer apparatus to calculate a pseudoinverse of the first measurement data.

17. The computer program product of claim 15, wherein the instructions configured to cause the computer apparatus to decompose the mapping are further configured to cause the computer apparatus to calculate an eigenvalue decomposition for the mapping matrix and use eigenvalues in an eigenvalue matrix representing different scaling to identify one or more eigenvectors that represent the first deformation.

18. The computer program product of claim 14, wherein the instructions are further configured to cause the computer apparatus to perform together the determination of the mapping and decomposition of the mapping using non-linear optimization.

19. The computer program product of claim 14, wherein the instructions configured to cause the computer apparatus to decompose the mapping are further configured to cause the computer apparatus to constrain eigenvalues of an eigenvalue matrix to separately determine eigenvectors representing the first deformation.

20. The computer program product of claim 14, wherein the first measurement data is obtained by measurement of position of a plurality of features across the plurality of substrates using an optical metrology system illuminating with a first color and the second measurement data is obtained by measurement of position of a plurality of features across the plurality of substrates using an optical metrology system illuminating with a second color or wherein the first measurement data is obtained by measurement with a first plurality of colors and the second measurement data is obtained by measurement with a second plurality of colors.

* * * * *